(12) United States Patent
Wong et al.

(10) Patent No.: US 7,498,892 B2
(45) Date of Patent: Mar. 3, 2009

(54) SPLIT-BIASED INTERPOLATED VOLTAGE-CONTROLLED OSCILLATOR AND PHASE LOCKED LOOP

(75) Inventors: Keng L. Wong, Portland, OR (US); Mingwei Huang, Portland, OR (US); David Duarte, Portland, OR (US); Shuching Hsu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 11/724,102

(22) Filed: Mar. 14, 2007

(65) Prior Publication Data

US 2008/0231382 A1 Sep. 25, 2008

(51) Int. Cl.
*H03B 5/24* (2006.01)
*H03K 3/03* (2006.01)
*H03L 7/099* (2006.01)

(52) U.S. Cl. .......................... 331/57; 331/10; 331/34; 331/177 R; 331/179

(58) Field of Classification Search .................. 331/10, 331/11, 57, 143, 175, 177 R, 179, 185, 186, 331/34
See application file for complete search history.

(56) References Cited

U.S. PATENT DOCUMENTS 7,088,191 B2 * 8/2006 Paillet et al. .................. 331/57

* cited by examiner

*Primary Examiner*—David Mis
(74) *Attorney, Agent, or Firm*—Seth Z. Kalson

(57) ABSTRACT

A voltage-controlled oscillator (VCO) of ring-connected stages, where each stage in the VCO has a first set of differential inverters biased by variable bias voltages, and a second set of differential inverters biased by fixed bias voltages. The differential inverters in each stage are connected in parallel with each other. Each set of differential inverters in a stage may contain only one differential inverter. The variable bias voltages are provided by charge pumps and associated circuits as used in well-known self-biasing schemes for phase locked loops. The fixed bias voltages are provided by a biasing circuit, matched to the circuits associated with the charge pumps, but where a fixed control voltage is applied to provide the fixed bias voltages.

9 Claims, 3 Drawing Sheets

SPLIT-BIASED INTERPOLATED VOLTAGE-CONTROLLED OSCILLATOR AND PHASE LOCKED LOOP

FIELD

The present invention relates to analog circuits, and more particularly, to phase locked loops and voltage-controlled oscillators.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
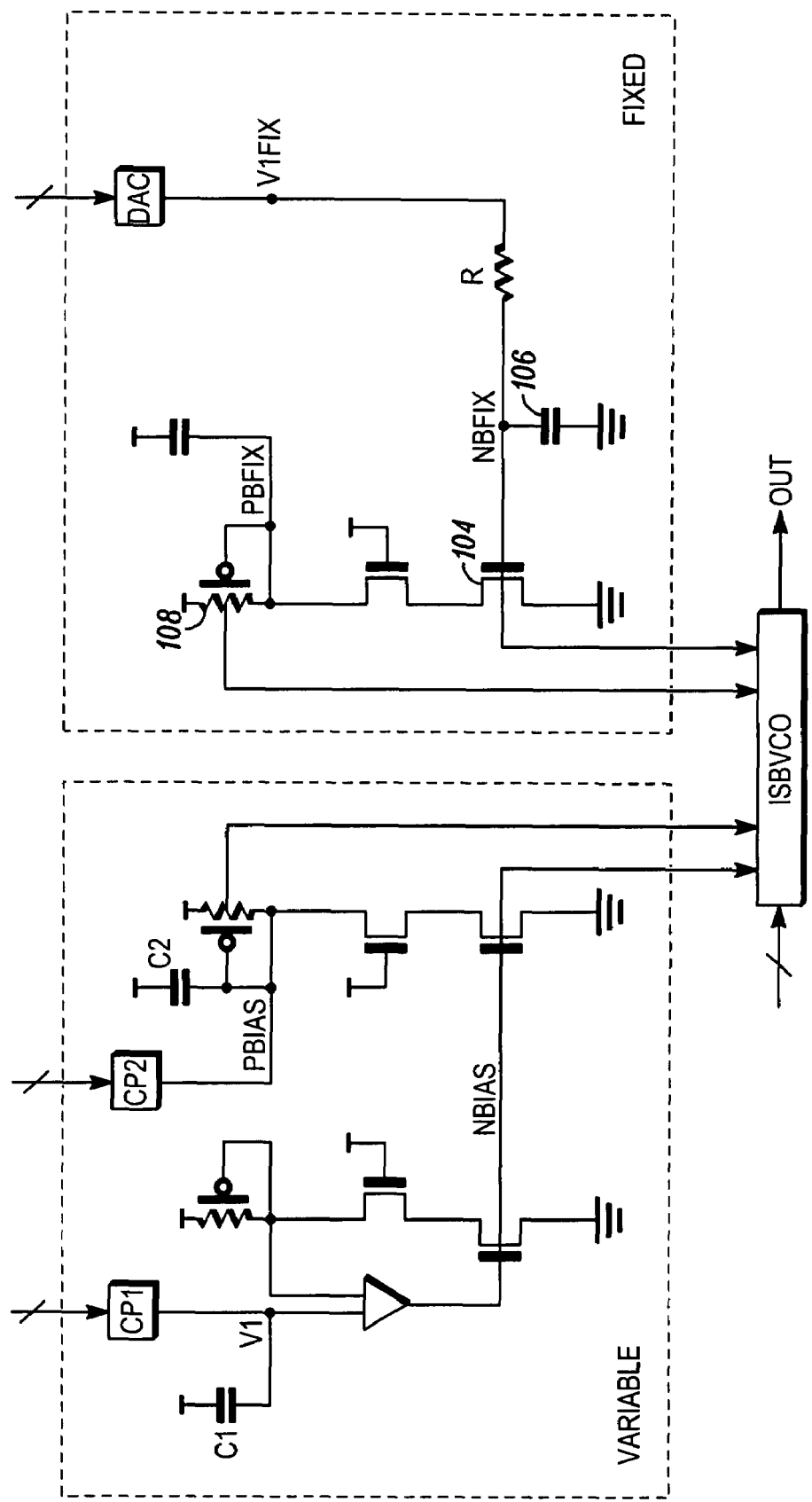
FIG. 1 illustrates a portion of a phase locked loop according to an embodiment of the present invention.

FIG. 1 illustrates a portion of a phase locked loop according to an embodiment of the present invention. Three circuit blocks are identified in FIG. 1, a so-called variable circuit block labeled as "variable"; a so-called fixed circuit block labeled as "fixed"; and a voltage-controlled oscillator labeled as "ISBVCO" for Interpolated-Self-Biased-Voltage-Controlled-Oscillator. Within the variable circuit block are two charge pumps for dual-charge pump applications, denoted as CP1 and CP2, and two loop capacitors, denoted as C1 and C2.

The variable circuit provides two bias voltages, denoted as "nbias" and "pbias". Generating these bias voltages is well-known in the art of self-biasing phase locked loops. See, for example, "Low-Jitter Process-Independent DLL and PLL Based on Self-Biased Techniques," by J. G. Maneatis, IEEE Journal of Solid-State Circuits, vol., 31, no. 11, November 1996, pp. 1723-1732. Bias voltages pbias and nbias provide bias voltages to ISBVCO.

The fixed circuit provides two bias voltages, denoted as pbfix and nbfix. The fixed circuit has a DAC (Digital-to-Analog-Converter) for providing an analog voltage, denoted as V1 fix, as a function of a set of input bits (voltages). This fixed analog voltage is provided to resister R, where the bias voltage nbfix is the voltage on capacitor 106. The combination of resistor R and capacitor 106 serves as a low-pass RC filter. Other low-pass filters may be employed. The bias voltage nbfix serves to bias the gate of nMOSFET (n-Metal-Oxide-Semiconductor-Field-Effect-Transistor) 104. The bias voltage pbfix is generated at the drain of pMOSFET 108. The symbol chosen for pMOSFET 108 indicates that it is configured as a voltage-controlled resistor, with its gate connected to its drain. (Similar symbols are used for other pMOSFETs serving as voltage-controlled resistors.) Bias voltages pbfix and nbfix provide bias voltages to ISBVCO.

Figure 2:
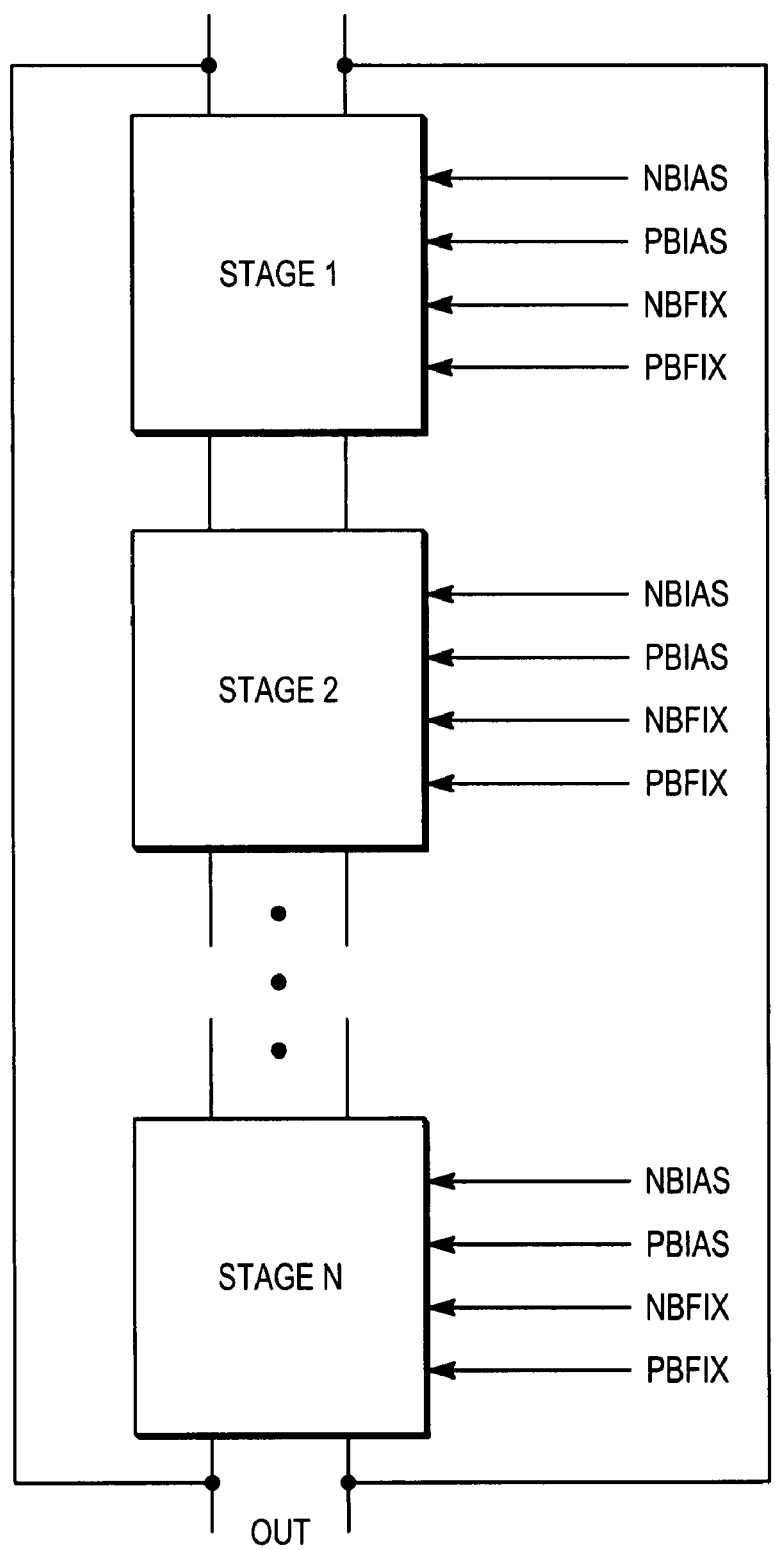
FIG. 2 illustrates a voltage-controlled oscillator according to an embodiment of the present invention.

FIG. 2 illustrates the stages of an ISBVCO according to an embodiment of the present invention. Illustrated in FIG. 2 are N stages, where N is an odd integer. Each stage in FIG. 2 has a differential voltage for its input, and outputs a differential voltage, where the output differential voltage of the final stage is provided back to the input of the first stage, so that the stages are connected as a ring oscillator. Each differential stage is biased by the bias voltages nbias, pbias, nbfix, and pbfix.

Figure 3:
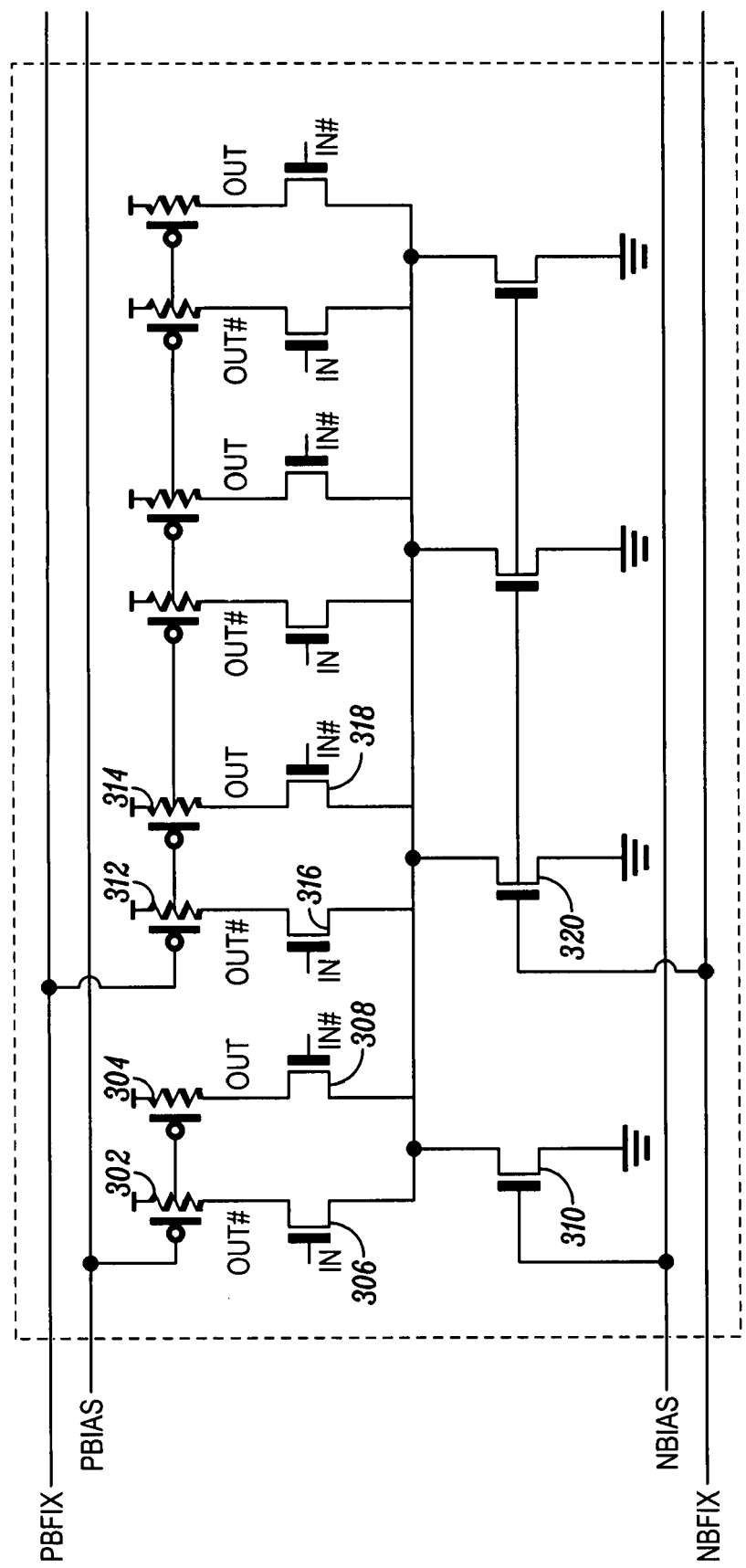
FIG. 3 illustrates a stage of a voltage-controlled oscillator according to an embodiment of the present invention.

FIG. 3 illustrates an example of a stage of an ISBVCO at the component level. In the particular example of FIG. 3, there are four differential inverters, one biased with the voltages pbias and nbias, and the other three biased with the voltages pbfix and nbfix. All of the input ports labeled "IN" are connected to each other, all of the input ports labeled "IN#" are connected to each other, all of the output ports labeled "OUT" are connected to each other, and all of the output ports labeled "OUT#" are connected to each other, so that all of the differential inverters are connected in parallel. For simplicity, these hardwired connections are not explicitly shown in FIG. 3. The symbol # denotes the usual complementary notation, so that before the input voltages are driven to full rail, ideally the voltages at input ports IN and IN# are equidistant from the common-mode voltage. When driven to full rail, the voltage at IN represents the logical complement of the voltage at IN#. Similar remarks apply to the voltages on the output ports OUT and OUT#.

In the example of FIG. 3, the differential inverter biased by the voltages pbias and nbias comprises pMOSFETs 302 and 304, and the differential pair of nMOSFETs 306 and 308. The tail current for the differential pair 306 and 308 is provided by nMOSFET 310. The gates of pMOSFETs 302 and 304 are biased at the voltage pbias, and the voltage nbias biases the gate of nMOSFET 310. An example of a differential inverter biased by the voltages pbfix and nbfix is the combination comprising pMOSFETs 312 and 314, differential pair 316 and 318, and nMOSFET 320, where the gates of pMOSFETs 312 and 314 are biased at pbfix, and the gate of nMOSFET 320 is biased at nbfix.

Other embodiments may have a different number of differential inverters biased at the voltages pbfix and nbfix, and a different number of differential inverters biased at the voltages pbias and nbias, than the particular example of FIG. 3. For some embodiments, the number of parallel connected differential inverters may be changed by switching in, or switching out, various differential inverters from each stage of the ISBVCO.

By utilizing stages having one or more differential inverters biased by voltages pbias and nbias, and one or more differential inverters biased by voltages pbfix and nbfix, the resulting ISBVCO may be conceptualized as being partitioned into fixed and variable sections, where a fixed section comprises differential inverters biased by voltages pbfix and nbfix, and a variable section comprises differential inverters biased by voltages pbias and nbias. It is expected that for many embodiments, the fixed section is more dominant than the variable section in the sense that the number of differential inverters biased by voltages pbfix and nbfix is greater than the number of differential inverters biased by voltages pbias and nbias. In the particular example of FIG. 3, the ratio of fixed to variable sections is 3:1.

In terms of biasing, a phase locked loop employing an ISBVCO retains the self-biasing scheme of prior art self-biased phase locked loops, where a wide range control voltage V1 (see FIG. 1) is used to change the voltages nbias and pbias. The fixed circuit of FIG. 1 has a similar, but separate, bias front-end as the variable circuit, except that the voltage V1 fix, corresponding to V1 in the variable circuit, is fixed at a DC voltage by way of DAC. As a result, the corresponding bias voltages, nbfix and pbfix, are heavily decoupled from Vss (ground or substrate voltage rail) and Vcc (supply voltage rail), respectively. Because pbfix is heavily decoupled from Vcc, it is expected that embodiments have good PSRR (Power Supply Rejection Ratio). Because of the heavy decoupling, the bias front-end portion of the fixed circuit is expected to have very low noise.

Because only the variable circuit and sections play a part in phase locked loop tracking, the resulting phase locked loop is expected to operate over a wide control voltage (V1) range. However, the frequency range is attenuated at the ISBVCO due to the variable and fixed sections of the ISBVCO. But, simulations have shown that ISBVCO embodiments have relatively low gain. Because of the low gain, it is expected that there should be less jitter feedthrough from a reference clock, lower conversion of bias voltage thermal noise to output frequency noise, lower conversion of supply noise induced at the bias circuitry to output jitter, as well as lower conversion of control voltage ripple and reference clock noise into output jitter. In addition, during the pumping of the proportional charge pump CP2, the voltage swing in the ISBVCO, and its common mode voltage, is expected to remain stable, thereby easing the amplification of the signal and unintended conversion of common mode noise to output jitter. A lower gain may also allow smaller capacitor C1, thereby resulting in smaller die area.

Various modifications may be made to the disclosed embodiments without departing from the scope of the invention as claimed below.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected together by an interconnect (transmission line). In integrated circuit technology, the interconnect may be exceedingly short, comparable to the device dimension itself. For example, the gates of two transistors may be connected together by polysilicon, or copper interconnect, where the length of the polysilicon, or copper interconnect, is comparable to the gate lengths. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is neverless a device or circuit that is connected to both A and B. This device or circuit may include active or passive circuit elements, where the passive circuit elements may be distributed or lumped-parameter in nature. For example, A may be connected to a circuit element that in turn is connected to B.

It is also to be understood in these letters patent that a "current source" may mean either a current source or a current sink. Similar remarks apply to similar phrases such as, "to source current".

It is also to be understood in these letters patent that various circuit components and blocks, such as current mirrors, amplifiers, etc., may include switches so as to be switched in or out of a larger circuit, and yet such circuit components and blocks may still be considered connected to the larger circuit.

What is claimed is:

1. A circuit comprising a voltage-controlled oscillator, the voltage-controlled oscillator comprising:
    a first set of differential inverters biased by a first set of two bias voltages;
    a second set of differential inverters biased by a second set of two bias voltages;
    a first charge pump to provide a control voltage;
    an operational amplifier comprising an input port at the control voltage and an output port to provide a first bias voltage in the first set of two bias voltages; and
    a second charge pump to provide a second bias voltage in the first set of two bias voltages.

2. The circuit as set forth in claim 1, further comprising:
    a digital-to-analog converter and a low-pass filter to provide a first bias voltage in the second set of two bias voltages;
    a first nMOSFET comprising a gate connected to the low-pass filter;
    a second nMOSFET connected to the first nMOSFET and comprising a gate held at a supply rail voltage; and
    a pMOSFET connected to the second nMOSFET and comprising a gate and a drain connected to each other, wherein the gate of the pMOSFET provides a second bias voltage in the second set of two bias voltages.

3. A circuit comprising a voltage-controlled oscillator, the voltage-controlled oscillator comprising:
    a first set of differential inverters biased by a first set of two bias voltages;
    a second set of differential inverters biased by a second set of two bias voltages;
    a digital-to-analog converter and a low-pass filter to provide a first bias voltage in the second set of two bias voltages;
    a first nMOSFET comprising a gate connected to the low-pass filter;
    a second nMOSFET connected to the first nMOSFET and comprising a gate held at a supply rail voltage; and
    a pMOSFET connected to the second nMOSFET and comprising a gate and a drain connected to each other, wherein the gate of the pMOSFET provides a second bias voltage in the second set of two bias voltages.

4. A circuit comprising a voltage-controlled oscillator, the voltage-controlled oscillator comprising a set of stages connected as a ring, each stage comprising:
    a first set of differential inverters, each comprising first and second pMOSFETs, each pMOSFET comprising a gate biased at a voltage pbias, each comprising a differential pair, and each comprising an nMOSFET to provide a tail current to the differential pair and having a gate biased at a voltage nbias; and
    a second set of differential inverters, each comprising first and second pMOSFETs, each pMOSFET comprising a gate biased at a voltage pbfix, each comprising a differential pair, and each comprising an nMOSFET to provide a tail current to the differential pair and having a gate biased at a voltage nbfix.

5. The circuit as set forth in claim 4, wherein the first set of differential inverters in each stage comprises only one differential inverter.

6. The circuit as set forth in claim 4, wherein the second set of differential inverters in each stage comprises only one differential inverter.

7. The circuit as set forth in claim 4, wherein for each stage, the first and second set of differential inverters are connected in parallel with each other.

8. The circuit as set forth in claim 7, further comprising:
    a low-pass filter to provide the voltage nbfix in response to a fixed voltage;
    a first nMOSFET comprising a gate held at the voltage nbfix;
    a second nMOSFET connected to the first nMOSFET and comprising a gate held at a supply rail voltage; and a pMOSFET connected to the second nMOSFET and comprising a gate and a drain connected to each other, wherein the gate of the pMOSFET provides the voltage pbfix.

9. The circuit as set forth in claim 8, further comprising:
a first charge pump to provide a control voltage;
an operational amplifier comprising an input port at the control voltage and an output port to provide the voltage nbias; and
a second charge pump to provide the voltage pbias.

* * * * *